United States Patent
Yamagishi

(10) Patent No.: US 6,860,711 B2
(45) Date of Patent: Mar. 1, 2005

(54) SEMICONDUCTOR-MANUFACTURING DEVICE HAVING BUFFER MECHANISM AND METHOD FOR BUFFERING SEMICONDUCTOR WAFERS

(75) Inventor: Takayuki Yamagishi, Tama (JP)

(73) Assignee: ASM Japan K.K., Tokyo (JP)

( * ) Notice: Subject to any disclaimer, the term of this patent is extended or adjusted under 35 U.S.C. 154(b) by 178 days.

(21) Appl. No.: 10/187,670

(22) Filed: Jul. 1, 2002

(65) Prior Publication Data
US 2003/0021657 A1 Jan. 30, 2003

(30) Foreign Application Priority Data
Jul. 24, 2001 (JP) ........................................ 2001-222962

(51) Int. Cl.[7] .............................................. B65G 49/07
(52) U.S. Cl. ...................................................... 414/941
(58) Field of Search ................................ 414/147, 160, 414/222.01, 331.01, 331.14, 935, 936, 941, 217, 217.1

(56) References Cited

U.S. PATENT DOCUMENTS

| | | | | |
|---|---|---|---|---|
| 5,643,366 A | * | 7/1997 | Somekh et al. | 118/729 |
| 5,848,670 A | * | 12/1998 | Salzman | 187/272 |
| 5,883,017 A | * | 3/1999 | Tepman et al. | 438/800 |
| 6,168,668 B1 | * | 1/2001 | Yudovsky | 118/715 |
| 6,305,898 B1 | * | 10/2001 | Yamagishi et al. | 414/744.5 |
| 6,485,248 B1 | * | 11/2002 | Taylor, Jr. | 414/672 |
| 6,555,164 B1 | * | 4/2003 | Yudovsky | 427/248.1 |
| 6,575,737 B1 | * | 6/2003 | Perlov et al. | 432/81 |
| 6,630,053 B2 | * | 10/2003 | Yamagishi et al. | 156/345.32 |
| 6,702,865 B1 | * | 3/2004 | Ozawa et al. | 29/25.01 |
| 6,709,521 B1 | * | 3/2004 | Hiroki | |

FOREIGN PATENT DOCUMENTS

JP         411288988 A   * 10/1999

* cited by examiner

Primary Examiner—Richard Ridley
(74) Attorney, Agent, or Firm—Knobbe Martens Olson & Bear, LLP

(57) ABSTRACT

A semiconductor-manufacturing device is equipped with a load-lock chamber and a reactor, which are directly connected, wherein a semiconductor wafer is transferred by a transferring arm provided inside the load-lock chamber from the load-lock chamber onto a susceptor provided inside the reactor. The device includes a buffer mechanism for keeping a semiconductor wafer standing by inside the reactor. The buffer mechanism includes at least two supporting means, which are provided around the susceptor to support the semiconductor wafer and which rotate in a horizontal direction, a shaft means for supporting the supporting means in a vertical direction, a rotating mechanism for rotating the supporting means coupled to the shaft means, and an elevating means for moving the shaft means up and down.

14 Claims, 4 Drawing Sheets

SEMICONDUCTOR-MANUFACTURING DEVICE HAVING BUFFER MECHANISM AND METHOD FOR BUFFERING SEMICONDUCTOR WAFERS

BACKGROUND OF THE INVENTION

1. Field of the Invention

The present invention relates to a semiconductor-manufacturing device using a vacuum load-lock system, and the invention particularly relates to a semiconductor-manufacturing device comprising a reactor having a buffer mechanism and its method for buffering semiconductor substrates.

2. Description of the Related Art

Generally, chambers of a semiconductor-manufacturing device using a vacuum load-lock system, which is used for manufacturing conventional semiconductor integrated circuits, comprise a load-lock chamber, a transfer chamber and multiple reactors (process chambers) connected to the transfer chamber. For each chamber, a wafer transfer robot is used for supplying wafers automatically. The semiconductor-manufacturing device using a vacuum load-lock system operates in the following manner: First, an atmospheric robot carries a wafer from a cassette or a front opening unified pod ("FOUP", e.g., a box possessing detachable cassettes and a front opening interface) into a load-lock chamber. After evacuating air from the load-lock chamber, the wafer is transferred to each reactor by a vacuum robot provided inside a common polygonal transfer chamber. Wafers for which processing in the reactor is finished, are transferred into the load-lock chamber by the vacuum robot. Finally, after inside the load-lock chamber is restored to atmospheric pressure, processed wafers are transferred to the cassette or the FOUP by an atmospheric robot. Such devices are generally called "cluster tools".

Conventionally, cluster tools have a single-wafer-processing type and a batch wafer-processing type. The single-wafer-processing type is a type in which a single wafer is processed by each reactor. The batch wafer-processing type is a type in which multiple wafers are processed by a single reactor.

With the batch wafer-processing type, productivity is high because multiple wafers are processed by a single reactor. In batch processing, the occurrence of non-uniformity of film thickness and film quality of a thin film formed on a wafer frequently becomes a problem. To improve uniformity of film thickness and film quality, using a single-wafer-processing type wafer processing device is effective.

Problems that the invention can resolve are as follows:

In order to increase productivity using a conventional single-wafer-processing type processing device, the number of reactors increases, a footprint (device space required) and a faceprint (the panel width of a device front) increase, and costs run up. This is because the device has a common polygonal transfer room and reactors are attached to it radially. Additionally, due to the increase in the number of reactors, output significantly drops if operation discontinues due to device breakdowns or maintenance.

Furthermore, in the thin film deposition process, it is often the case that process time is short and the processes are performed consecutively. For these reasons, if keeping the next wafer standing by inside a load-lock chamber, a wafer transferring mechanism needs to have double arms. If equipping the wafer transferring mechanism with the double arms, the transferring mechanism complexifies and costs run up. Additionally, the capacity of the load-lock chamber increases, hence time required for evacuating air and time required for restoring to atmospheric pressure are lengthened and transfer rate-limiting factors increase. As a result, throughput is restricted.

Furthermore, even in a device using a regular polygonal type transfer chamber, for the purpose of carrying in and out wafers inside the reactor efficiently, although the wafer transferring mechanism having double arms is better, the transferring mechanism complexifies and costs run up.

SUMMARY OF THE INVENTION

Accordingly, an object of the present invention is to provide a semiconductor-manufacturing device that realizes low costs, a small footprint and a small faceprint.

Another object of the present invention is to provide a semiconductor-manufacturing device that realizes stable processes and high throughput.

To achieve the above-mentioned objects, the semiconductor-manufacturing device according to the present invention comprises the following means:

In an embodiment, the present invention provides a buffer mechanism for keeping a semiconductor wafer standing by inside a reactor, comprising: (i) at least two supports for supporting the semiconductor wafer, which are disposed around a susceptor provided in the reactor and which rotate in a horizontal direction; (ii) one shaft each for supporting each support in a vertical direction; (iii) a rotating mechanism for rotating each support coupled to the shaft; and (iv) an elevating mechanism for elevating and descending each shaft.

In an embodiment, each support may have an inner edge curved along a circumference of the semiconductor wafer to line-contact the back of the semiconductor wafer, although any suitable shape (e.g., a triangle, a circle, a rectangle, etc.) can be used as long as the support can support the wafer. In other embodiments, the rotating mechanism may be a rotary actuator operated electrically or by air pressure. The elevating mechanism may be a cylinder mechanism operated electrically or by air pressure. The buffer mechanism may further comprise bellows wherein the shaft is provided with the bellows and coupled to the elevating mechanism. The buffer mechanism may further comprise an O-ring, wherein the shaft is coupled to the rotating mechanism and sealed by the O-ring. The O-ring may comprise a resin seal such as a lip seal or Teflon®.

In another aspect, the present invention provides a single-wafer-processing reactor comprising: (A) a susceptor for placing a semiconductor wafer thereon, said susceptor being movable upward and downward; (B) a gate valve, through which a transferring arm extends into and retracts from an interior of the reactor; (C) wafer lift pins for lifting the semiconductor wafer, said wafer lift pins being provided in the susceptor at positions where the wafer lift pins do not interfere with movement of the transferring arm, said wafer lift pins being movable upward and downward independently of movement of the susceptor; and (D) the buffer mechanism described above.

In yet another aspect, the present invention provides a semiconductor-manufacturing device comprising: (a) the reactor described above; (b) a load-lock chamber connected to the reactor through the gate valve; and (c) a transferring arm for transferring a semiconductor wafer between the reactor and the load-lock chamber through the gate valve.

The present invention can be applied equally to a method for buffering a semiconductor wafer in a reactor, wherein a wafer is loaded in or unloaded from the reactor at a loading position. The method may comprises: (i) supporting a first wafer on wafer lift pins provided in a susceptor provided in the reactor; (ii) placing supports provided around the susceptor between the susceptor and the first wafer on the wafer lift pins; (iii) rotating the supports toward the inside of the susceptor; (iv) elevating the supports to support the first wafer at a stand-by position which is higher than the loading position; (v) loading a second wafer on the susceptor while the first wafer is at the stand-by position; (vi) descending the wafer lift pins to descend the first wafer; and (vii) unloading the first wafer from the reactor.

The above method may include a method for buffering a processed semiconductor wafer in a reactor, wherein a semiconductor wafer is transferred into or out of the reactor at a transferring position while a susceptor is at an initial position, and a semiconductor wafer is processed at a processing position. The method comprises: (A) descending the susceptor from the processing position to the initial position while wafer lift pins remain elevated to support a processed semiconductor wafer on the wafer lift pins after processing is complete; (B) placing at least two supports provided around the susceptor between the susceptor and the semiconductor wafer on the wafer lift pins; (C) rotating the supports toward the inside of the susceptor; (D) elevating the supports to support the semiconductor wafer at a stand-by position which is higher than the transferring position; (E) descending the wafer lift pins to a position lower than the transferring position; (F) transferring an unprocessed semiconductor wafer from a load-lock chamber to the transferring position over the susceptor by a transferring arm; (G) elevating the wafer lift pins to support the unprocessed semiconductor wafer detached from the transferring arm; (H) retracting the transferring arm inside the load-lock chamber; (I) descending the wafer lift pins to descend the unprocessed semiconductor wafer below the transferring position; (J) extending the transferring arm into the reactor; (K) descending the supports supporting the processed semiconductor wafer to place the processed semiconductor wafer on the transferring arm; (L) retracting the transferring arm inside the load-lock chamber; (M) rotating the supports toward the outside of the susceptor; and (N) elevating the susceptor on which the unprocessed semiconductor wafer is placed to the processing position.

The above is for buffering a wafer-to-be-unloaded. However, the present invention can be applied equally to a method for buffering a wafer-to-be-loaded. In an embodiment, a semiconductor wafer is buffered in a reactor, wherein a wafer is loaded in or unloaded from the reactor at a loading position. The method comprises: (i) supporting a first wafer at the loading position above a second wafer placed on a susceptor provided in the reactor; (ii) placing supports provided around the susceptor between the susceptor and the first wafer at the loading position; (iii) rotating the supports toward the inside of the susceptor; (iv) elevating the supports to support the first wafer at a stand-by position which is higher than the loading position; and (v) unloading the second wafer from the reactor.

The above method may include a method for buffering an unprocessed semiconductor wafer in a reactor wherein a semiconductor wafer is transferred into or out of the reactor at a transferring position while a susceptor is at an initial position, and a semiconductor wafer is processed at a processing position, said method comprising: (AI) descending the susceptor together with wafer lift pins at the initial position after processing is complete, on which a processed semiconductor wafer is placed; (B) transferring an unprocessed semiconductor wafer from a load-lock chamber into the reactor at the transferring position by the transferring arm; (C) rotating supports provided around a susceptor toward the inside of the susceptor, said supports being positioned between the susceptor and the unprocessed semiconductor wafer on the transferring arm; (D) elevating the supports to support the unprocessed semiconductor wafer at a stand-by position which is higher than the transferring position; (E) retracting the transferring arm inside the load-lock chamber; (F) elevating the wafer lift pins to elevate the processed semiconductor wafer at the transferring position; (G) extending the transferring arm into the reactor under the processed semiconductor wafer supported on the wafer lift pins; (H) descending the wafer lift pins to place the processed semiconductor wafer on the transferring arm; (I) retracting the transferring arm to the load-lock chamber; (J) elevating the wafer lift pins to receive the unprocessed semiconductor wafer at the stand-by position; (K) descending the supports to detach the unprocessed semiconductor wafer therefrom; (L) rotating the supports toward the outside of the susceptor; and (M) elevating the susceptor to the processing position to process the unprocessed semiconductor wafer.

In the present invention, "buffering" means temporarily suspending a processed or unprocessed substrate in a reactor while another substrate is transferred into or out of the reactor.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 1(*b*) is a modified side view of the device, which is modified in such a way that the wafer lift pins and the buffering mechanism can be shown.

FIG. 2(*b*) shows schematic operation diagrams of the reactor.

The symbols used in the figures are as follows: 1: Reactor; 2: Load-lock chamber; 3: Transferring arm; 4: Supporting means; 5: Supporting means; 6: Cylinder; 7: Susceptor drive motor; 8: Cylinder; 9: Rotary actuator; 10: Bellows; 11: Rotary actuator; 12: Semiconductor wafer; 13: Gate valve; 14: Susceptor; 15: Wafer lift pin; 16: O-ring; 17: Shaft means; 18: Dry pump; 19: Showerhead; 20: Flapper valve

DETAILED DESCRIPTION OF THE PREFERRED EMBODIMENT

Figure 1A:
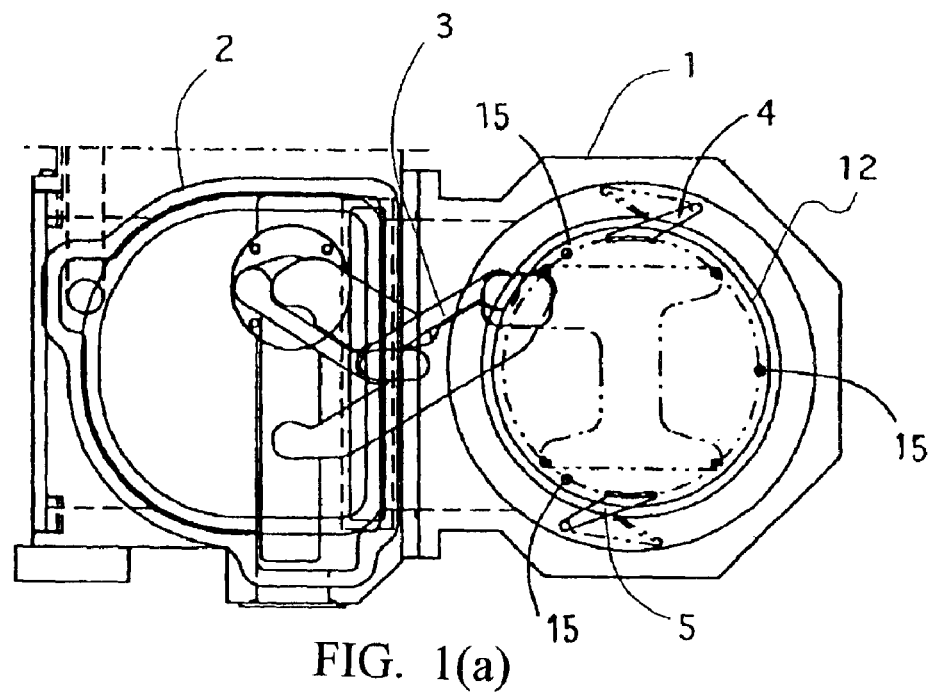
FIG. 1(*a*) is a plan view of the device.
Figure 1B:
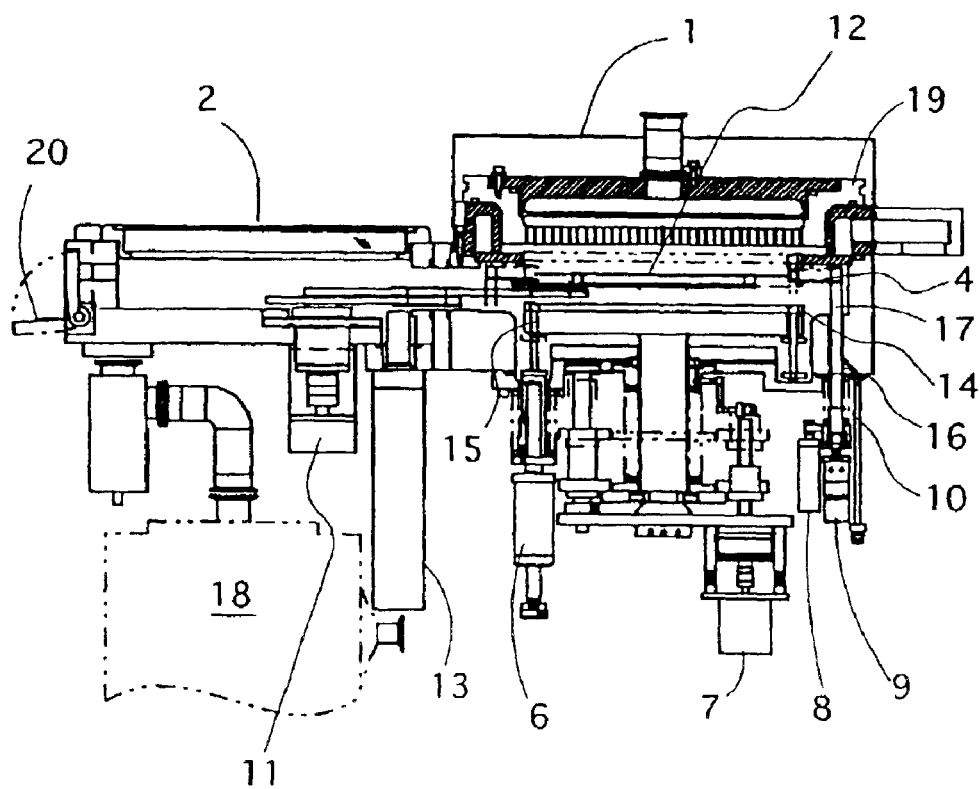

The present invention is described in detail by referring to figures. FIG. 1 shows the best mode for carrying out the compact single-wafer-processing type semiconductor-manufacturing device for forming a thin film on a semiconductor wafer according to the present invention. FIG. 1(a) is a plan view of the device. FIG. 1(b) is a side view of the device. The best mode for carrying out the semiconductor-manufacturing device comprises a reactor 1 for growing a film on a semiconductor wafer, a load-lock chamber 2 for keeping a semiconductor wafer 12 standing by in vacuum, which the load-lock chamber 2 is directly connected to the reactor 1 through a gate valve 13, and a wafer-transferring arm 3 provided inside the load-lock chamber 2, which is a wafer-transferring arm having one thin link-type arm shaft for transferring the semiconductor wafer 12 into the reactor 1.

In the reactor 1, a susceptor 14, on which the semiconductor wafer 12 is placed, and a shower plate 19 for equally emitting a jet of reaction gas to the semiconductor wafer 12 are provided. In a plasma enhanced CVD (PECVD), the susceptor 14 and the shower plate 19 together comprise high-frequency power electrodes. By reducing a distance between the susceptor 14 and the shower plate 19, a plasma reaction area can be reduced.

Near the circumference of the susceptor 14, at least three wafer lift pins 15 attached at even intervals pass right through the susceptor vertically. The wafer lift pins 15 can move up and down by a cylinder 6.

Near the periphery of the susceptor 14, at least one pair of a buffer mechanism is provided. The buffer mechanism concerned has at least 2 (e.g., 2, 3, or 4) supporting means (4, 5) for supporting the semiconductor wafer 12, which are provided around the susceptor 14 and which rotate in a horizontal direction. Rotations of the supporting means are synchronized, and only when buffering the semiconductor wafer, the supporting means rotate toward the inside of the susceptor 14 to support the wafer. The supporting means (4, 5) comprise preferably a thin plate material of 2 mm to 5 mm in width. The shape of the supporting means (4, 5) is not limited as long as the shape can support the wafer 12 stably. If the contact area of the supporting means with the wafer is large, it causes contamination. For this reason, it is preferable that the shape of a portion of the supporting means (4, 5), which contacts the back side of the wafer, is a shape curving along the circumference so that the portion line-contacts the back side of the wafer. Additionally, as a material used for the supporting means (4, 5), to avoid contamination, ceramics or aluminum is preferable. Each of the supporting means (4, 5) is coupled to the upper end of a shaft means 17 and is supported vertically. The lower end of the shaft means 17 is coupled to a rotary actuator 9, and the supporting means is rotated by the rotary actuator. The shaft means 17 and the rotary actuator 9 are isolated from the outside by bellows 10. Furthermore, the shaft means 17 is sealed preferably by an O-ring 16. The rotary actuator 9 can be operated electrically or by air pressure. To the lower end of the shaft means 17, a cylinder 8 is dynamically connected. The cylinder 8 can move the shaft means 17 up and down, and by this, the supporting means (4, 5) move up and down as well. The cylinder 8 can be operated electrically or by air pressure. The diameter of the shaft means 17 is preferably within the range of 8 mm to 16 mm. As a material used for the shaft means 17, to avoid contamination, ceramics or aluminum is preferable.

A point to notice here is that although the semiconductor-manufacturing device shown in FIG. 1 comprises one load-lock chamber and one reactor that is directly connected to the load-lock chamber, the present invention is not limited to this embodiment. For example, by arranging two units shown in FIG. 1 in parallel and making a load-lock chamber commonly used, it is possible to apply the present invention to a modularized semiconductor-manufacturing device comprising one load-lock chamber and two reactors. In this regard, using an independent transfer system, two wafers can be concurrently transferred to the reactors and wafers can be processed concurrently in two reactors. Additionally, the buffer mechanism according to the present invention can be applied to all semiconductor-manufacturing devices having a any suitable single-wafer-processing type reactor. For example, the buffer mechanism also can be applied to any suitable single-wafer-processing type semiconductor-manufacturing devices (e.g., Eagle 10™ manufactured by Japan ASM) in which a load-lock chamber and a reactor are connected through a transfer chamber.

An operation sequence in the case where the buffer mechanism of the semiconductor-manufacturing device shown in FIG. 1 is not used, is described. First, an atmospheric robot (not shown) carries a semiconductor wafer 12 from a cassette or a FOUP (not shown) into respective load-lock chambers 2 through a flapper valve 20. After carrying-in of the wafer is finished, the flapper valve 20 is closed, and air is evacuated from the load-lock chamber 2 by a dry pump 18. A gate valve 13 is opened, a wafer transferring arm 3 having a thin-link type arm extends by a rotary actuator 11, and the semiconductor wafer 12 is transferred onto a susceptor 14 inside the reactor 1. Because the wafer transferring arm 3 comprising a link-type arm only reciprocates between the load-lock chamber 2 and the reactor 1 in a straight-line direction, only mechanical positioning adjustment is required and no complicate teaching is required. A substrate lift pins 15 protrude from the surface of the susceptor 14 to support the semiconductor wafer 12. The wafer transferring arm 3 is placed inside the load-lock chamber 2, and the gate valve 13 is closed. The susceptor 14 goes up by a susceptor drive motor 7, and the semiconductor wafer 12 is placed on the surface of the susceptor 14. After that, thin-film deposition processing onto the semiconductor wafer 12 begins. After the thin-film deposition processing is finished, the processed semiconductor wafer is transferred to he cassette or the FOUP by tracking back the order of the operation sequence inversely this time.

As described, in the semiconductor-manufacturing device not having a buffer mechanism, because only one transferring arm per reactor exists, there was a problem that throughput is limited by a transfer rate-determining factor. To solve this problem, the present invention is achieved.

Figure 2A:
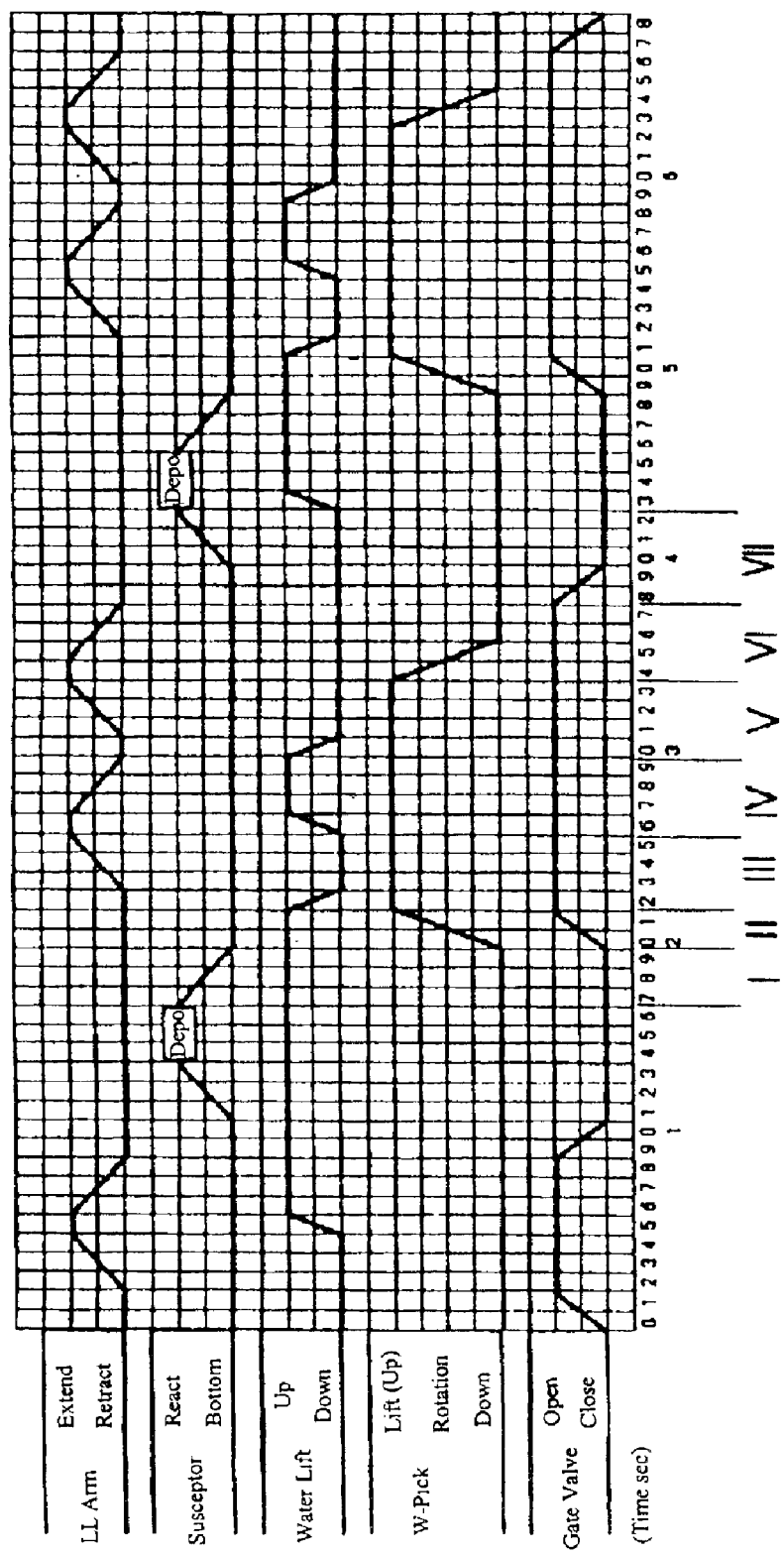
FIG. 2(*a*) shows a control sequence for buffering a processed wafer.
Figure 2B:
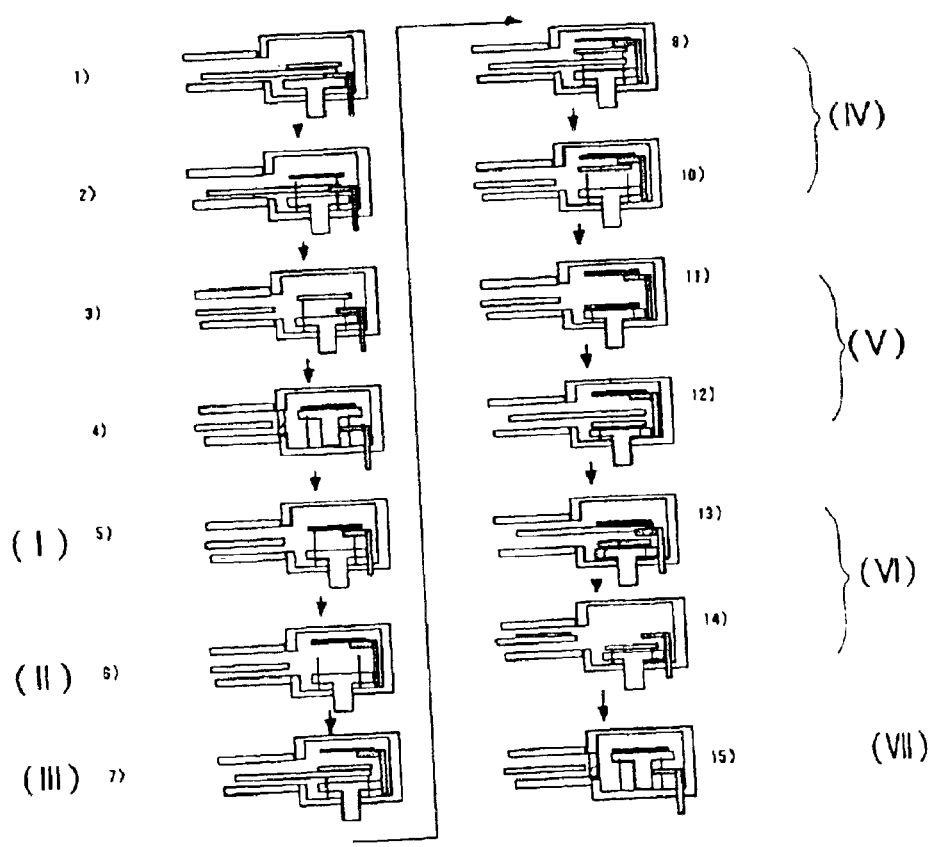

An operation sequence utilizing the buffer mechanism according to the present invention is described in detail below. FIG. 2(a) shows an operation sequence when buffering a processed wafer. FIG. 2(b) shows schematic diagrams of reactor operations. First, after vapor deposition onto a semiconductor wafer is finished, with wafer lift pins 15 being raised, a susceptor 14 is lowered (Process I). By opening a gate valve 13, the supporting means (4, 5) of the buffer mechanism are raised and stand by, holding the processed wafer. (Process II). The wafer lift pins 15 go down to the position of the susceptor, a transferring arm 3 extends from a load-lock chamber 2 and transfers an unprocessed semiconductor wafer onto the susceptor (Process III). While the wafer lift pins 15 go up and hold the unprocessed semiconductor wafer, the transferring arm returns inside the load-lock chamber 2 (Process IV). The semiconductor wafer lift pins 15 go down to a susceptor position, and the transferring arm extends inside the reactor again (Process V). The supporting means (4, 5) of the buffer mechanism go down, and after the processed wafer is placed on the transferring arm 3, the transferring arm 3 returns into the load-lock chamber 2 (Process VI). Finally, the gate valve is closed, and the susceptor on which the unprocessed semiconductor wafer is placed goes up so that the next vapor deposition is performed (Process VII). After this, this operating sequence is repeated.

Figure 3:
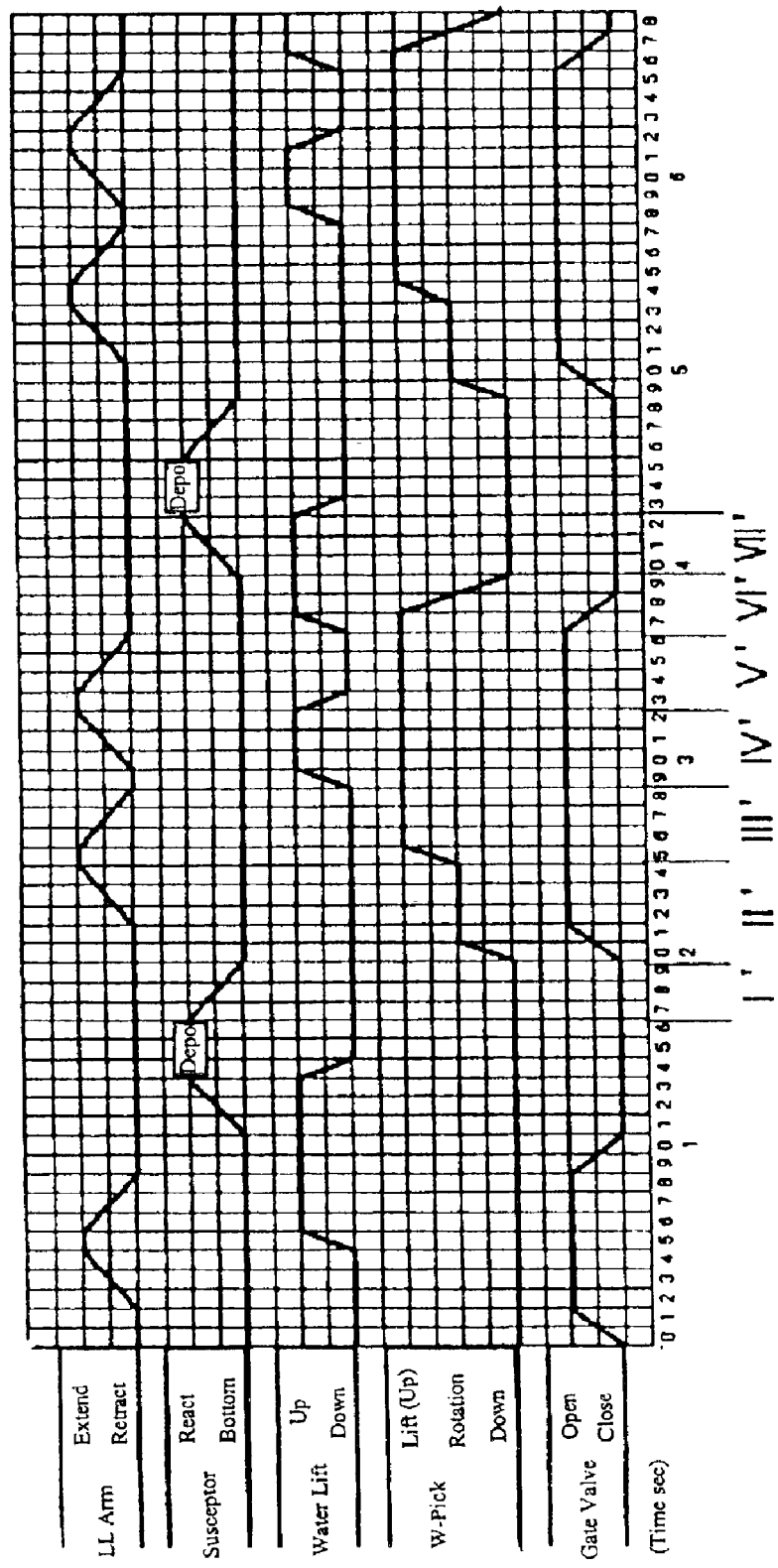
FIG. 3 shows a control sequence for buffering an unprocessed wafer.

FIG. 3 shows an operation sequence when buffering an unprocessed wafer. First, after vapor deposition to a semiconductor wafer 12 is finished, with the wafer lift pins 15 being lowered, the susceptor 14 is lowered (Process I'). The gate valve 13 is opened, an unprocessed semiconductor wafer 12 is transferred into the reactor 1 by the transferring arm 3, and the supporting means (4, 5) of the buffer mechanism rotate toward the inside of the susceptor 14 (Process II'). The supporting means (4, 5) of the buffer mechanism go up and stand by, holding the unprocessed semiconductor wafer, and the transferring arm returns into the load-lock chamber (Process III'). The wafer lift pins 15 are raised, and the transferring arm extends inside the reactor again (Process IV'). The wafer lift pins 15 are lowered, and the transferring arm receives a processed semiconductor wafer and returns inside the load-lock chamber 2 (Process V'). The wafer lift pins go up, the gate valve is closed, the supporting means (4, 5) of the buffer mechanism go down, the wafer lift pins receive the unprocessed semiconductor wafer, and the supporting means (4, 5) of the buffer mechanism rotate toward the outside of the susceptor (Process VI'). Finally, the susceptor 14 is raised, and vapor deposition of the semiconductor wafer is performed (Process VII'). After this, this operating sequence is repeated.

As explained above, the present invention includes the following embodiments:

A semiconductor-manufacturing device comprises a single-wafer-processing type reactor comprising a buffer mechanism for keeping a semiconductor wafer standing by inside the reactor. The buffer mechanism comprises at least two supporting means, which are provided around a susceptor to support the semiconductor wafer and which rotate in a horizontal direction, a shaft means for supporting each supporting means in a vertical direction, a rotating mechanism for rotating each supporting means coupled to the shaft means, and an elevating means for moving each shaft means up and down.

A method for buffering a processed semiconductor wafer using the buffer mechanism comprises (I) a process in which the susceptor is lowered with wafer lift pins being raised after processing is finished, (II) a process in which the supporting means of the buffer mechanism are arranged between the under surface of the semiconductor wafer and the susceptor, are rotated to inside the susceptor, and move upwards to stand by for supporting the semiconductor wafer, (III) a process in which the wafer lift pins are lowered to the position of the susceptor and an unprocessed semiconductor wafer is transferred from a load-lock chamber onto the susceptor by a transferring arm, (IV) a process in which the transferring arm returns inside the load-lock chamber while the wafer lift pins go up and hold the unprocessed semiconductor wafer, (V) a process in which the wafer lift pins go down to the position of the susceptor again and the transferring arm is inserted in the reactor, (VI) a process in which the supporting means of the buffer mechanism go down and the processed wafer is placed on the transferring arm and is returned inside the load-lock chamber, and (VII) a process in which the supporting means of the buffer mechanism rotate to outside the susceptor and the susceptor on which an unprocessed semiconductor wafer is placed goes up.

A method for buffering an unprocessed semiconductor wafer using the buffer mechanism comprises (i) a process in which the susceptor is lowered with wafer lift pins being lowered after processing is finished, (ii) a process in which an unprocessed semiconductor wafer is transferred from the load-lock chamber into the reactor by the transferring arm, the supporting means of the buffer mechanism, which are arranged between the under surface of the unprocessed semiconductor wafer and the susceptor, are rotated to inside the susceptor, (iii) a process in which the transferring arm returns inside the load-lock chamber concurrently when the supporting means of the buffer mechanism goes up to keep the unprocessed semiconductor wafer standing by, (iv) a process in which the wafer lift pins are raised and the transferring arm is inserted inside the reactor, again, (v) a process in which the wafer lift pins are lowered and a processed semiconductor wafer is placed on the transferring arm and the transferring arm returns to the load-lock chamber, (vi) a process in which the wafer lift pins go up again, the supporting means of the buffer mechanism goes down, the wafer lift pins receive the unprocessed wafer and the supporting means of the buffer mechanism rotates to outside the susceptor, and (vii) a process in which the susceptor is raised and the unprocessed semiconductor wafer is processed.

The present invention can exhibit at least the following effects:

By the buffer mechanism according to the present invention, by keeping a processed or unprocessed wafer standing by inside the reactor, a processed wafer and an unprocessed wafer inside the load-lock chamber can be switched. In doing so, despite the configuration having one transferring arm per reactor, a device with ability equivalent to that with double arms was able to be achieved. Consequently, the problem caused by the transfer rate-limiting factors is solved and a semiconductor-manufacturing device realizing stable processes and high throughput can be realized.

Additionally, because the capacity of a load-lock chamber can be reduced as compared with a conventional device with double arms, a semiconductor-manufacturing device realizing low costs, a small footprint and a small faceprint can be provided.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A buffer mechanism for keeping a semiconductor wafer standing by inside a reactor, comprising:
   two supports for supporting the semiconductor wafer, which are disposed around a susceptor provided in the reactor and which rotate in a horizontal direction, each support having an inner edge curved along a circumference of the semiconductor wafer to line-contact a back of the semiconductor wafer;
   two shaft each for supporting each support in a vertical direction;
   a rotating mechanism for rotating each support coupled to the shaft; and
   an elevating mechanism for elevating and descending each shaft.

2. The buffer mechanism as claimed in claim 1, wherein said rotating mechanism is a rotary actuator operated electrically or by air pressure.

3. The buffer mechanism as claimed in claim 1, wherein said elevating mechanism is a cylinder mechanism operated electrically or by air pressure.

4. The buffer mechanism as claimed in claim 1, which further comprises bellows wherein said shaft is provided with the bellows and coupled to the elevating mechanism.

5. The buffer mechanism as claimed in claim 1, which further comprises an O-ring, wherein said shaft is coupled to the rotating mechanism and sealed by the O-ring.

6. The buffer mechanism as claimed in claim 5, wherein said O-ring comprises a resin seal.

7. A single-wafer-processing reactor comprising:
- a susceptor for placing a semiconductor wafer thereon, said susceptor being movable upward and downward;
- a gate valve, through which a transferring arm extends into and retracts from an interior of the reactor;
- wafer lift pins for lifting the semiconductor wafer, said wafer lift pins being provided in the susceptor at positions where the wafer lift pins do not interfere with movement of the transferring arm, said wafer lift pins being movable upward and downward independently of movement of the susceptor; and
- the buffer mechanism of claim 1.

8. A semiconductor-manufacturing device comprising:
- the reactor of claim 1;
- a load-lock chamber connected to the reactor through the gate valve; and
- a transferring arm for transferring a semiconductor wafer between the reactor and the load-lock chamber through the gate valve.

9. A buffer mechanism for keeping a semiconductor wafer standing by inside a reactor, comprising:
- at least two supports for supporting the semiconductor wafer, which are disposed around a susceptor provided in the reactor and which rotate in a horizontal direction, each support having an inner edge curved along a circumference of the semiconductor wafer to line-contact a back of the semiconductor wafer;
- shafts each for supporting each support in a vertical direction;
- a rotating mechanism for rotating each support coupled to the shaft;
- an elevating mechanism for elevating and descending each shaft;
- bellows wherein said shaft is provided with the bellows and coupled to the elevating mechanism; and
- an O-ring, wherein said shaft is coupled to the rotating mechanism and sealed by the O-ring.

10. The buffer mechanism as claimed in claim 9, wherein said rotating mechanism is a rotary actuator operated electrically or by air pressure.

11. The buffer mechanism as claimed in claim 9, wherein said elevating mechanism is a cylinder mechanism operated electrically or by air pressure.

12. The buffer mechanism as claimed in claim 9, wherein said O-ring comprises a resin seal.

13. A single-wafer-processing reactor comprising:
- a susceptor for placing a semiconductor wafer thereon, said susceptor being movable upward and downward;
- a gate valve, through which a transferring arm extends into and retracts from an interior of the reactor;
- wafer lift pins for lifting the semiconductor wafer, said wafer lift pins being provided in the susceptor at positions where the wafer lift pins do not interfere with movement of the transferring arm, said wafer lift pins being movable upward and downward independently of movement of the susceptor; and
- the buffer mechanism of claim 9.

14. A semiconductor-manufacturing device comprising:
- the reactor of claim 9;
- a load-lock chamber connected to the reactor through the gate valve; and
- a transferring arm for transferring a semiconductor wafer between the reactor and the load-lock chamber through the gate valve.

* * * * *